United States Patent
Cha et al.

(10) Patent No.: US 12,344,120 B2
(45) Date of Patent: Jul. 1, 2025

(54) BATTERY MANAGEMENT SYSTEM, BATTERY MANAGEMENT METHOD, BATTERY PACK, AND ELECTRIC VEHICLE

(71) Applicant: LG Energy Solution, Ltd., Seoul (KR)

(72) Inventors: A-Ming Cha, Daejeon (KR); Yoon-Jung Bae, Daejeon (KR); Dae-Soo Kim, Daejeon (KR); Bo-Mi Lim, Daejeon (KR); Hyun-Jun Choi, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 450 days.

(21) Appl. No.: 17/921,397

(22) PCT Filed: Aug. 13, 2021

(86) PCT No.: PCT/KR2021/010835
§ 371 (c)(1),
(2) Date: Oct. 26, 2022

(87) PCT Pub. No.: WO2022/035293
PCT Pub. Date: Feb. 17, 2022

(65) Prior Publication Data
US 2023/0191942 A1    Jun. 22, 2023

(30) Foreign Application Priority Data

Aug. 13, 2020   (KR) .................. 10-2020-0101932
Aug. 12, 2021   (KR) .................. 10-2021-0106953

(51) Int. Cl.
*G01R 31/3842* (2019.01)
*B60L 58/12* (2019.01)
(Continued)

(52) U.S. Cl.
CPC .......... *B60L 58/12* (2019.02); *G01R 31/3842* (2019.01); *H01M 10/425* (2013.01);
(Continued)

(58) Field of Classification Search
CPC . H02J 7/007182; H02J 7/00032; B60L 58/12; H01M 10/44; H01M 10/48;
(Continued)

(56) References Cited

U.S. PATENT DOCUMENTS

| | | |
|---|---|---|
| 2016/0061908 A1 | 3/2016 | Torai et al. |
| 2016/0072313 A1 | 3/2016 | Satou |

(Continued)

FOREIGN PATENT DOCUMENTS

| | | |
|---|---|---|
| CN | 109659641 B | 7/2020 |
| JP | 2009195036 A | 8/2009 |

(Continued)

OTHER PUBLICATIONS

International Search Report for PCT/KR2021/010835 mailed Nov. 23, 2021. 3 pgs.

(Continued)

*Primary Examiner* — Nathaniel R Pelton
(74) *Attorney, Agent, or Firm* — Lerner David LLP (57) ABSTRACT

A battery management system includes a sensor to sense voltage and current of a battery, memory to store overpotential management information including reference peak and reference peak voltage values, and a controller to command constant-current charging using a maximum allowable C-rate to a charging circuit when the reference peak value is equal to or larger than a threshold peak value, in response to a charge request, determine a differential capacity curve indicating a correlation between the voltage and differential capacity of the battery within a range based on the sensed voltage and current during the charging, determine main peak and main peak voltage values indicating differential capacity and voltage of a peak of the differential capacity curve, respectively, and update the reference peak and reference peak voltage values to equal the main (Continued)

peak and main peak voltage values, when the main peak value is less than the threshold peak value.

12 Claims, 7 Drawing Sheets

(51) Int. Cl.
*H01M 10/42* (2006.01)
*H01M 50/204* (2021.01)

(52) U.S. Cl.
CPC ..... *H01M 50/204* (2021.01); *B60L 2240/547* (2013.01); *B60L 2240/549* (2013.01); *H01M 2010/4271* (2013.01)

(58) Field of Classification Search
CPC ........ H01M 10/425; H01M 2010/4271; G01R 31/3835; G01R 31/367; G01R 31/3648
USPC .................................................. 320/109, 137
See application file for complete search history.

(56) References Cited

U.S. PATENT DOCUMENTS

| | | | |
|---|---|---|---|
| 2017/0126023 | A1 | 5/2017 | Jung |
| 2019/0168617 | A1* | 6/2019 | Ling ..................... H01M 10/44 |
| 2020/0119562 | A1* | 4/2020 | Jung ........................ H02J 7/04 |

FOREIGN PATENT DOCUMENTS

| | | | |
|---|---|---|---|
| JP | 201319709 | A | 1/2013 |
| JP | 201654082 | A | 4/2016 |
| JP | 6461684 | B2 | 1/2019 |
| KR | 101227951 | B1 | 1/2013 |
| KR | 20170006964 | A | 1/2017 |
| KR | 20170051031 | A | 5/2017 |
| KR | 101878538 | B1 | 7/2018 |

OTHER PUBLICATIONS

Extended European Search Report for Application No. 21856299.9 dated Nov. 16, 2023. 5 pgs.

* cited by examiner

BATTERY MANAGEMENT SYSTEM, BATTERY MANAGEMENT METHOD, BATTERY PACK, AND ELECTRIC VEHICLE

CROSS-REFERENCE TO RELATED APPLICATIONS

The present application is a national phase entry under 35 U.S.C. § 371 of International Application No. PCT/KR2021/010835 filed Aug. 13, 2021, which claims priority from Korean Patent Application Nos. 10-2020-0101932 filed Aug. 13, 2020, and 10-2021-0106953 filed Aug. 12, 2021, all of which are incorporated herein by reference in their entirety.

TECHNICAL FIELD

The present disclosure relates to battery protection from over-potential during charging.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

While a battery is being charged, polarization occurs in the battery. The polarization depends on a plurality of resistance components (for example, Ohm resistance, electric charge transfer, diffusion resistance) of the battery. The battery voltage during charging higher than an open circuit voltage (OCV) is because of over-potential formed by polarization.

As the battery degrades, the polarization tends to become severer. Accordingly, even in the same charge condition (for example, charging current, temperature), the magnitude of over-potential may increase with the increasing degree of degradation of the battery.

However, when over-potential is too large, the degradation of the battery is accelerated. For example, during charging, the negative electrode potential of the battery gradually drops, and when the voltage of the negative electrode of the battery drops below 0 V due to the over-potential, lithium metal deposition rapidly occurs on the negative electrode surface, and as a result, losses of lithium ions that can participate in the charge/discharge reactions may increase and internal short circuits may occur.

SUMMARY

Technical Problem

According to at least one of the embodiments of the present disclosure, the present disclosure is directed to providing a battery management system, a battery management method, a battery pack and an electric vehicle, in which a charge condition for suppressing over-potential is set based on over-potential management information updated through the previous cycle constant-current charging event prior to starting the present cycle constant-current charging.

Additionally, the present disclosure is further directed to providing a battery management system, a battery management method, a battery pack and an electric vehicle, in which the over-potential management information for the next cycle constant-current charging is updated based on position information of at least one peak appearing in the differential capacity curve for the threshold voltage range obtained through the present cycle constant-current charging event.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a voltage sensor configured to generate a voltage sensing signal indicating a voltage of a battery, a current sensor configured to generate a current sensing signal indicating a voltage of a battery, memory configured to store over-potential management information including a reference peak value and a reference peak voltage value, and a controller, wherein the memory has programmed thereon instructions that, when executed by the controller, cause the controller to command first constant-current charging using a maximum allowable current rate (C-rate) to a charging circuit connected to the battery, in response to the reference peak value being equal to or larger than a threshold peak value when a charge request is received, determine a first differential capacity curve indicating a correlation between the voltage of the battery and a differential capacity of the battery for a range of voltages within a threshold voltage range based on the voltage and current sensing signals generated during the first constant-current charging, determine a first main peak value indicating a differential capacity of a first peak of the first differential capacity curve, determine a first main peak voltage value indicating a voltage of the first peak of the first differential capacity curve, and update the reference peak value to be equal to the first main peak value and the reference peak voltage value to be equal to the first main peak voltage value, in response to the first main peak value being less than the threshold peak value.

The over-potential management information may further include a first reference ratio. The controller may be configured to determine a first reference C-rate by multiplying the maximum allowable C-rate by the first reference ratio in response to the reference peak value being less than the threshold peak value. The controller may be configured to command second constant-current charging using the first reference C-rate to the charging circuit in response to the first reference C-rate being equal to or larger than a minimum allowable C-rate.

The over-potential management information may further include a second reference ratio. The instructions may be configured to cause the controller to determine a second reference C-rate by multiplying the maximum allowable C-rate by the second reference ratio and command third constant-current charging using the second reference C-rate to the charging circuit, in response to the voltage of the battery reaching a turnover voltage value smaller than the reference peak voltage value by a scaling voltage value during the second constant-current charging. The instructions may be configured to cause the controller to determine a second differential capacity curve indicating a correlation between the voltage and the differential capacity of the battery in the threshold voltage range based on the voltage and current sensing signals generated during the second constant-current charging and the third constant-current charging. The instructions may be configured to cause the controller to determine a third main peak value indicating a differential capacity of a first peak of the second differential capacity curve and determine a third main peak voltage value indicating a voltage of the first peak of the second differential capacity curve. The instructions may be configured to cause the controller to update the reference peak value to be equal to the third main peak value and the reference peak voltage value to be equal to the third main peak voltage value, in response to the third main peak value being less than the threshold peak value.

The instructions may be configured to cause the controller to output a charge disable message in response to the first reference C-rate being less than the minimum allowable C-rate.

The over-potential management information may further include a second reference ratio. The instructions may be configured to cause the controller to determine a second main peak value indicating a differential capacity of a second peak of the first differential capacity curve and a second main peak voltage value indicating a voltage of the second peak of the first differential capacity curve, in response to the first main peak value being less than the threshold peak value. The instructions may be configured to cause the controller to update the second reference ratio to be equal to the second reference ratio multiplied by a first offset value, in response to the first main peak value being larger than the second main peak value. The first offset value is a positive number less than 1. The instructions may be configured to cause the controller to update the second reference ratio to be equal to the second reference ratio multiplied by a second offset value, in response to the first main peak value being equal to or less than the second main peak value. The second offset value is a positive number less than 1 and smaller than the first offset value.

The instructions may be configured to cause the controller to update the first reference ratio to be equal to the first reference ratio multiplied by a third offset value, in response to the updated second reference ratio being equal to or less than a predetermined minimum ratio. The third offset value is a positive number less than 1.

The instructions may be configured to cause the controller to determine a fourth main peak value indicating a differential capacity of a second peak of the second differential capacity curve and a fourth main peak voltage value indicating a voltage of the second peak of the second differential capacity curve, in response to the third main peak value being less than the threshold peak value. The instructions may be configured to cause the controller to update the second reference ratio to be equal to the second reference ratio multiplied by a first offset value, in response to the third main peak value being larger than the fourth main peak value. The first offset value is a positive number less than 1.

The instructions may be configured to cause the controller to update the second reference ratio to be equal to the second reference ratio multiplied by a second offset value, in response to the third main peak value being equal to or less than the fourth main peak value. The second offset value is a positive number less than 1 and smaller than the first offset value.

A battery pack according to another aspect of the present disclosure includes the battery management system of any of the embodiments described herein.

An electric vehicle according to still another aspect of the present disclosure includes the battery pack.

A battery management method according to yet another aspect of the present disclosure includes commanding, by a controller, first constant-current charging using a maximum allowable C-rate to a charging circuit connected to a battery, in response to a reference peak value included in over-potential management information of the battery being equal to or larger than a threshold peak value, when a charge request is received, determining, by the controller, a first differential capacity curve indicating a correlation between a voltage of the battery and a differential capacity of the battery for a range of voltages within a threshold voltage range based on voltage and current measurements of the battery collected during the first constant-current charging, determining, by the controller, a first main peak value indicating a differential capacity of a first peak of the first differential capacity curve, determining, by the controller, a first main peak voltage value indicating a voltage of the first peak of the first differential capacity curve and updating, by the controller, the reference peak value to be equal to the first main peak value and the reference peak voltage value to be equal to the first main peak voltage value, in response to the first main peak value being less than the threshold peak value.

Advantageous Effects

According to at least one of the embodiments of the present disclosure, it is possible to set a charge condition for suppressing over-potential based on the over-potential management information updated through the previous cycle constant-current charging event, prior to starting the present cycle constant-current charging.

Additionally, according to at least one of the embodiments of the present disclosure, it is possible update the over-potential management information for the next cycle constant-current charging based on position information of at least one peak indicated in the differential capacity curve for the threshold voltage range obtained through the present cycle constant-current charging event.

Accordingly, it is possible to prevent lithium deposition that occurs when the negative electrode potential of the battery during constant-current charging drops too much.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

DETAILED DESCRIPTION

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

Figure 1:
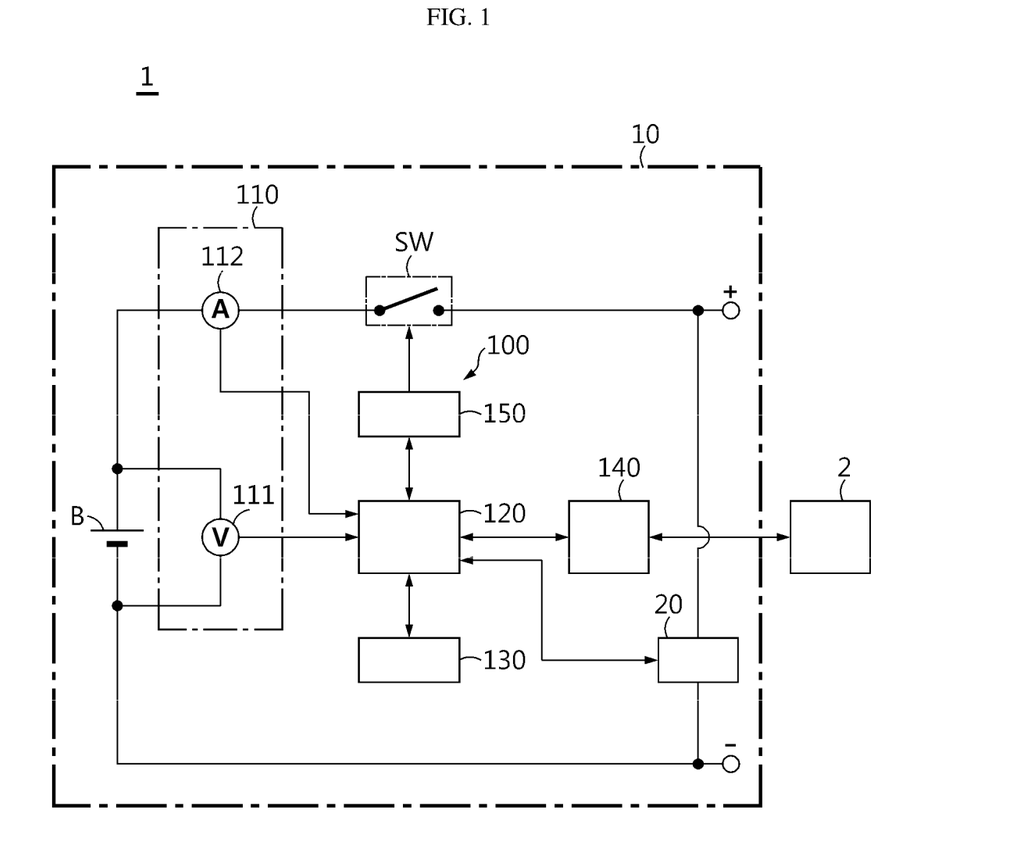
FIG. 1 illustrates exemplarily a diagram of an exemplary configuration of an electric vehicle according to the present disclosure.

FIG. 1 illustrates exemplarily a diagram of an exemplary configuration of an electric vehicle according to the present disclosure.

Referring to FIG. 1, a battery pack 10 is provided to be mounted in an electric power system such as the electric vehicle 1. The battery pack 10 includes a battery B, a switch SW, a charging circuit 20 and a battery management system 100.

Positive and negative electrode terminals of the battery B are electrically connected to the battery management system 100. The battery B is a lithium ion battery, and includes a positive electrode, a negative electrode and a separator. The separator is interposed between the positive electrode and the negative electrode, to isolate the positive electrode from the negative electrode. A positive electrode active material may include lithium metal composite oxide, for example, $LiNi_{8/10}Co_{1/10}Mn_{1/10}O_2$. A negative electrode active material may include, for example, a carbon-based material (for example, graphite).

When the polarization of the battery B is less than a predetermined level during charging, a single phase change reaction occurs in the negative electrode active material in a threshold voltage range (for example, 3.65~3.80 V). Accordingly, the capacity of the battery B greatly increases on the basis of the voltage at which the phase change reaction occurs in the negative electrode. The threshold voltage range may be preset through a charge test for a sample battery manufactured with the same electrochemical performance as the battery B. In contrast, as the polarization of the battery B becomes severer, the phase change reaction in the threshold voltage range may become weaker.

Accordingly, the differential capacity curve for the threshold voltage range may be obtained during charging of the battery B, and then the degree of polarization may be identified based on position information of each peak (for example, a maximum point, a minimum point) appearing in the differential capacity curve. The position information may include the peak value (or peak intensity) which is the differential capacity of the peak and/or the peak voltage which is the voltage of the peak.

The switch SW is installed on an electric current path connected in series to the battery B for the charge/discharge of the battery B. While the switch SW is turned on, the battery B can be charged/discharged. The switch SW may be a mechanical relay that is turned on/off by the electromagnetic force of a coil or a semiconductor switch such as a Metal Oxide Semiconductor Field Effect transistor (MOSFET). While the switch SW is turned off, the charge/discharge of the battery B is stopped. The switch SW may be turned on in response to a first switching signal (for example, high level voltage). The switch SW may be turned off in response to a second switching signal (for example, low level voltage).

The charging circuit 20 is electrically connected to the electric current path for the charge/discharge of the battery B. The charging circuit 20 is configured to convert alternating current (AC) power from an external device (for example, a commercial power source) to direct current (DC) power. The charging circuit 20 may include a constant-current circuit to regulate a current rate (referred to as 'C-rate') for constant-current charging in response to a command from the battery management system 100.

The battery management system 100 is provided to protect the battery B from over-potential formed by excessively high polarization. The battery management system 100 includes a sensing unit 110, a control unit 120 and a memory unit 130. The battery management system 100 may further include an interface unit 140. The battery management system 100 may further include a switch driver 150. At least one of the sensing unit 110, the memory unit 130, the interface unit 140 or the switch driver 150 may be packaged with the control unit 120 into a single chip.

The sensing unit 110 includes a voltage sensor 111 and a current sensor 112.

The voltage sensor 111 is connected in parallel to the battery B and configured to detect a voltage across the battery B and generate a voltage signal indicating the detected voltage.

The current sensor 112 is connected in series to the battery B through the electric current path. The current sensor 112 is configured to detect an electric current flowing through the battery B, and generate a current signal indicating the detected electric current. The control unit 120 may collect a sensing signal including the voltage signal and the current signal in synchronization from the sensing unit 110.

The control unit 120 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The control unit 120 is operably coupled to at least one of the charging circuit 20, the sensing unit 110 or the memory unit 130. Operably coupled refers to directly/indirectly connected to transmit and receive a signal in one or two directions. The control unit 120 is configured to perform an operation for protecting the battery B as described below.

When the voltage of the battery B is equal to or less than a predetermined start voltage, the control unit 120 may transmit a constant-current charging command to the charging circuit 20 in response to a charge request upon receiving the charge request from a high-level controller 2.

The control unit 120 is configured to determine the voltage, electric current, capacity and State-Of-Charge (SOC) of the battery B at a predetermined time interval based on the voltage signal and the electric current signal included in the sensing signal at the predetermined time interval during constant-current charging of the battery B.

The capacity of the battery B indicates an amount of charges stored in the battery B and may be referred to as 'remaining capacity'. The control unit 120 may determine the capacity of the battery B by accumulating the detected electric current value of the battery B at the predetermined time interval. The SOC of the battery B indicates a ratio of the capacity of the battery B to the maximum capacity (referred to as 'full charge capacity') of the battery B, and in general, it is represented as 0~1 or 0~100%. The maximum capacity of the battery B gradually decreases as the battery B degrades.

A voltage history, a current history and a capacity history respectively corresponding to the voltage, the current and the capacity obtained at the predetermined time interval during constant-current charging may be recorded in the memory unit 130 by the control unit 120. The capacity history is based on the current history. The history of a parameter refers to a time-dependent change, i.e., a time-series of the corresponding parameter over a period of time.

The memory unit 130 is operably coupled to the control unit 120. The memory unit 130 may be also operably coupled to the sensing unit 110. The memory unit 130 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM).

The memory unit 130 may store data and programs required for the computation operation by the control unit 120. The memory unit 130 may store data indicating the result of the computation operation by the control unit 120.

The interface unit 140 is configured to support wired or wireless communication between the control unit 120 and the high-level controller 2 (for example, Electronic Control Unit (ECU)) of the electric vehicle 1. The wired communication may be, for example, controller area network (CAN) communication, and the wireless communication may be, for example, Zigbee or Bluetooth communication. The communication protocol is not limited to a particular type, and may include any communication protocol that supports the wired/wireless communication between the control unit 120 and the high-level controller 2. The interface unit 140 may include an output device (for example, a display, a speaker) to provide information received from the control unit 120 and/or the high-level controller 2 in a recognizable format.

The switch driver 150 is electrically coupled to the control unit 120 and the switch SW. The switch driver 150 is configured to selectively output the first switching signal or the second switching signal to the switch SW in response to the command from the control unit 120. The control unit 120 may command the switch driver 150 to turn on the switch SW during constant-current charging of the battery B.

Figure 2:
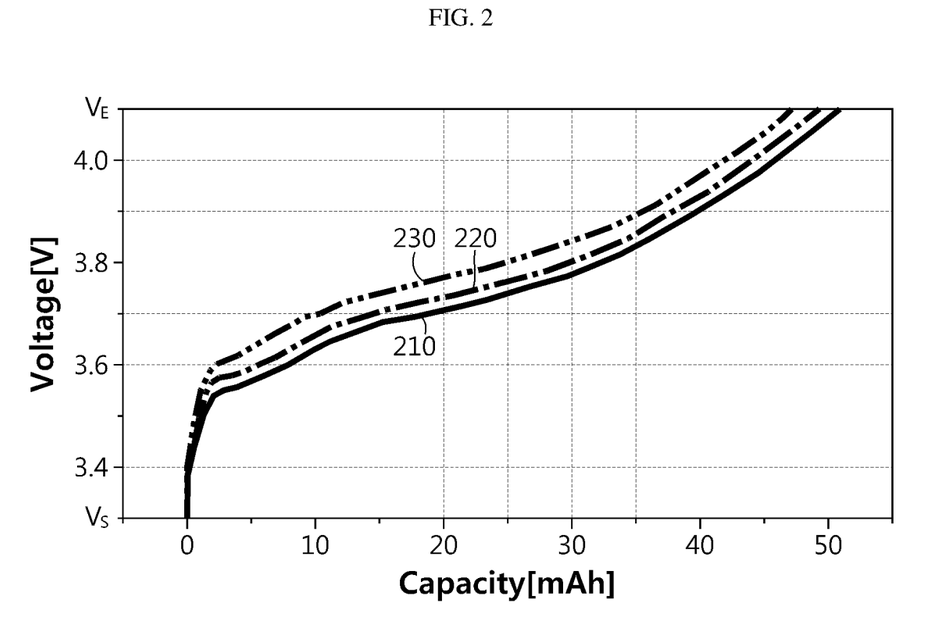
FIG. 2 illustrates exemplarily a diagram of a plurality of voltage curves respectively corresponding to a plurality of C-rates.
Figure 3:
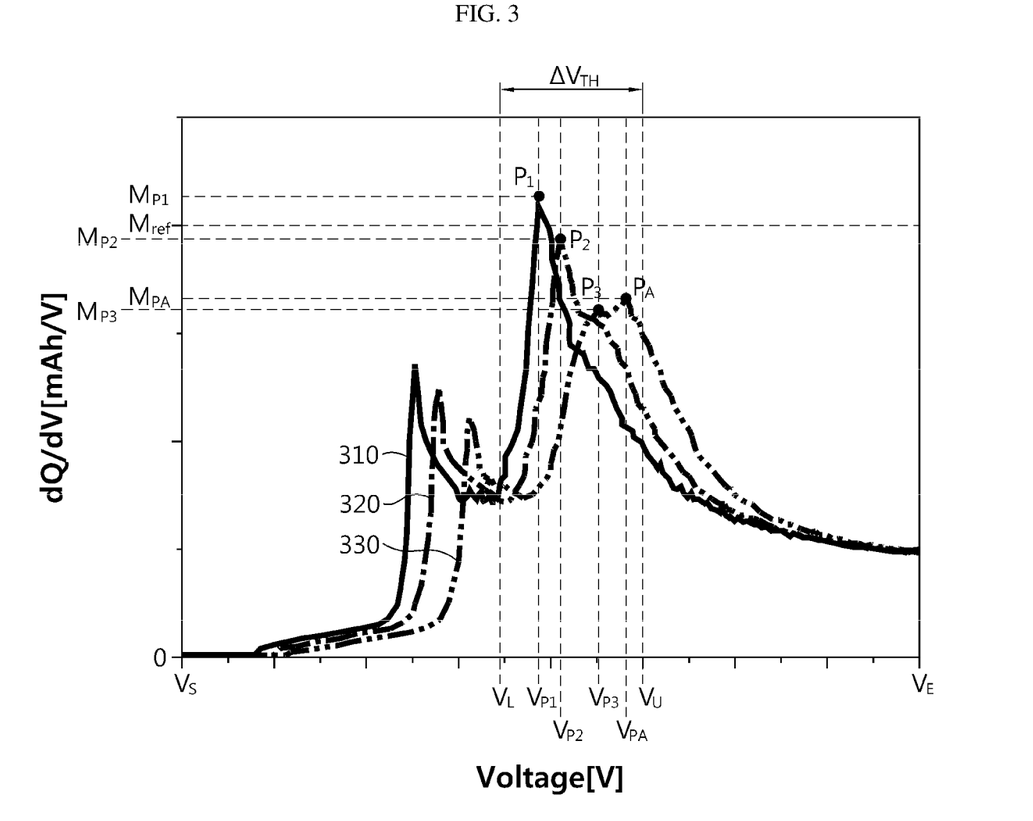
FIG. 3 illustrates exemplarily a diagram of a plurality of differential capacity curves respectively corresponding to the plurality of voltage curves of FIG. 2.

FIG. 2 illustrates exemplarily a diagram of a plurality of voltage curves respectively corresponding to a plurality of C-rates, and FIG. 3 illustrates exemplarily a diagram of a plurality of differential capacity curves respectively corresponding to the plurality of voltage curves of FIG. 2.

Referring to FIG. 2, each of the voltage curves 210, 220, 230 is the result obtained through a constant-current charging test for a plurality of sample batteries of the same specification as the battery B at beginning of life (BOL).

Specifically, the voltage curve 210 indicates the correlation between the voltage history and the capacity history of a sample battery during constant-current charging of the corresponding sample battery from a predetermined start voltage $V_S$ (for example, 3.3V) to a predetermined end voltage $V_E$ (for example, 4.1V) using the C-rate of 0.5 C.

The voltage curve 220 indicates the correlation between the voltage history and the capacity history of another sample battery during constant-current charging of the corresponding sample battery from the start voltage $V_S$ or less till the end voltage $V_E$ using the C-rate of 0.7 C.

The voltage curve 230 indicates the correlation between the voltage history and the capacity history of the other sample battery during constant-current charging of the corresponding sample battery from the start voltage $V_S$ to the end voltage $V_E$ using the C-rate of 1.0 C.

When comparing the voltage curves 210, 220, 230, on the basis of the horizontal axis indicating capacity, it can be seen that the voltage curve 230 is disposed above the voltage curve 220, and the voltage curve 220 is disposed above the voltage curve 210. That is, at the same capacity, the voltage curve 230 has higher voltage than the voltage curve 220, and the voltage curve 220 has higher voltage than the voltage curve 210. This result is because the over-potential accumulated in the sample battery during charging increases with the increasing C-rate.

Referring to FIG. 3, the differential capacity curves 310, 320, 330 are determined by differentiating the capacity of the voltage curves 210, 220, 230 of FIG. 2 with respect to the voltage, respectively. The differential capacity curves 310, 320, 330 indicate the correlation between the voltage V and the differential capacity dQ/dV of the corresponding voltage curves 210, 220, 230, respectively. The differential capacity dQ/dV refers to a ratio of a capacity change dQ to a voltage change dV of the battery. The differential capacity curves 310, 320, 330 may be derivatives of the corresponding voltage curves 210, 220, 230, respectively.

The following over-potential related features can be seen from the differential capacity curves 310, 320, 330.

The first feature is a gradual decrease in differential capacity (hereinafter, referred to as 'peak value') of a peak that appears for the first time in the threshold voltage range $\Delta V_{TH}$ as the C-rate used in constant-current charging increases. For example, peaks $P_1$, $P_2$, $P_3$ are the first peaks in the threshold voltage range $\Delta V_{TH}$ of the differential capacity curves 310, 320, 330, respectively, and the peak value $M_{P1}$ of the peak $P_1$ is larger than the peak value $M_{P2}$ of the peak $P_2$, and the peak value $M_{P2}$ of the peak $P_2$ is larger than the peak value $M_{P3}$ of the peak $P_3$. The peak value $M_{P2}$ and the peak value $M_{P3}$ are less than the threshold peak value $M_{ref}$, and this indicates the first over-potential state. In the specification, the first peak in the threshold voltage range $\Delta V_{TH}$ of the differential capacity curve refers to a single peak when only the corresponding peak exists in the threshold voltage range $\Delta V_{TH}$, and a specific peak of the lowest peak voltage when at least two peaks exist in the threshold voltage range $\Delta V_{TH}$.

The second feature is that when the magnitude of over-potential accumulated in the negative electrode during constant-current charging rises above a predetermined level, the second peak having a larger peak value than the peak value of the first peak in the threshold voltage range $\Delta V_{TH}$ may appear in the differential capacity curve. For example, in FIG. 3, within the threshold voltage range $\Delta V_{TH}$, only the peak $P_1$ appears in the differential capacity curve 310, and only the peak $P_2$ appears in the differential capacity curve 320. In contrast, it can be seen that the second the peak $P_4$ having a higher peak voltage $V_{P4}$ than the peak voltage $V_{P3}$ of the peak $P_3$ appears in the differential capacity curve 330. In FIG. 3, the peak value $M_{P4}$ of the peak $P_4$ is larger than the peak value $M_{P3}$ of the peak $P_3$, and this indicates the second over-potential state that may additionally occur after the first over-potential state already occurred.

The above-described over-potential state is because when the magnitude of over-potential rises above the predetermined level, the voltage equilibrium between the positive electrode and the negative electrode during charging gradually changes as well.

When considering the over-potential features described above with reference to FIGS. 2 and 3, it can be seen that it is possible to protect the battery B from excessively high over-potential by changing the charging condition of the present cycle constant-current charging event based on over-potential management information for the threshold voltage range $\Delta V_{TH}$ updated through the previous cycle constant-current charging event.

To this end, the control unit 120 may update the over-potential management information stored in the memory unit 130 each time the constant-current charging event is performed once. The over-potential management information includes a reference peak value and a reference peak voltage value. The over-potential management information may further include at least one of a first reference ratio or a second reference ratio. When the constant-current charging event for the battery B occurs for the first time, the reference peak value may be equal to the threshold peak value $M_{ref}$, the reference peak voltage value may be equal to the threshold peak voltage value, and each of the first reference ratio and the second reference ratio may be 1.

The threshold peak value $M_{ref}$ and the threshold peak voltage value may be respectively preset to be equal to or less than the differential capacity and the voltage value of the first peak appearing within the threshold voltage range $\Delta V_{TH}$ of the differential capacity curve corresponding to the voltage curve obtained by pulse charging of the sample battery at a predetermined threshold C-rate (for example, 0.1 C) from the start voltage $V_S$ to the upper limit $V_U$ of the threshold voltage range $\Delta V_{TH}$. For example, the threshold peak value $M_{ref}$ may be set in the range between the peak value $M_{P1}$ and the peak value $M_{P3}$, and the threshold peak voltage value may be set in the range between the peak voltage value $V_{P1}$ and the peak voltage value $V_{P3}$. For reference, the pulse charging refers to charging that repeats constant-current charging for a first period of time and resting for a second period of time. The over-potential formed by the constant-current charging for the first period of time is eliminated by the resting for the second period of time.

The lower limit $V_L$ and the upper limit $V_U$ of the threshold voltage range $\Delta V_{TH}$ may be appropriately set based on the result of the constant-current charging test individually using at least two different C-rates for the plurality of sample batteries.

Hereinafter, assume that the first peak appearing in the differential capacity curve for the threshold voltage range $\Delta V_{TH}$ is referred to as 'first main peak', the peak value of the first main peak as 'first main peak value', and the peak voltage value of the first main peak as 'first main peak voltage value'.

The reference peak value of the over-potential management information stored in the memory unit 130 equal to or larger than the threshold peak value $M_{ref}$ indicates that the first main peak value in the previous cycle constant-current charging event is equal to or larger than the threshold peak value $M_{ref}$, i.e., the first over-potential state and the second over-potential state are not detected. In this case, the present cycle constant-current charging event executed by the control unit 120 in response to the charge request does not need to change the charge condition for suppressing over-potential.

In contrast, the reference peak value of the over-potential management information stored in the memory unit 130 less than the threshold peak value $M_{ref}$ when the control unit 120 receives the charge request indicates that the first main peak value in the previous cycle constant-current charging event is less than the threshold peak value $M_{ref}$, i.e., the first over-potential state is detected. In this case, when the control unit 120 executes the present cycle constant-current charging event in response to the charge request, the control unit 120 may change the charge condition based on the reference peak voltage value, the first reference ratio and/or the second reference ratio of the over-potential management information. The first reference ratio is a control factor that may be optionally used to determine the C-rate at the start of the constant-current charging event. The second reference ratio is a control factor that may be used to change the C-rate of the charge current during constant-current charging of the battery B.

Figure 4:
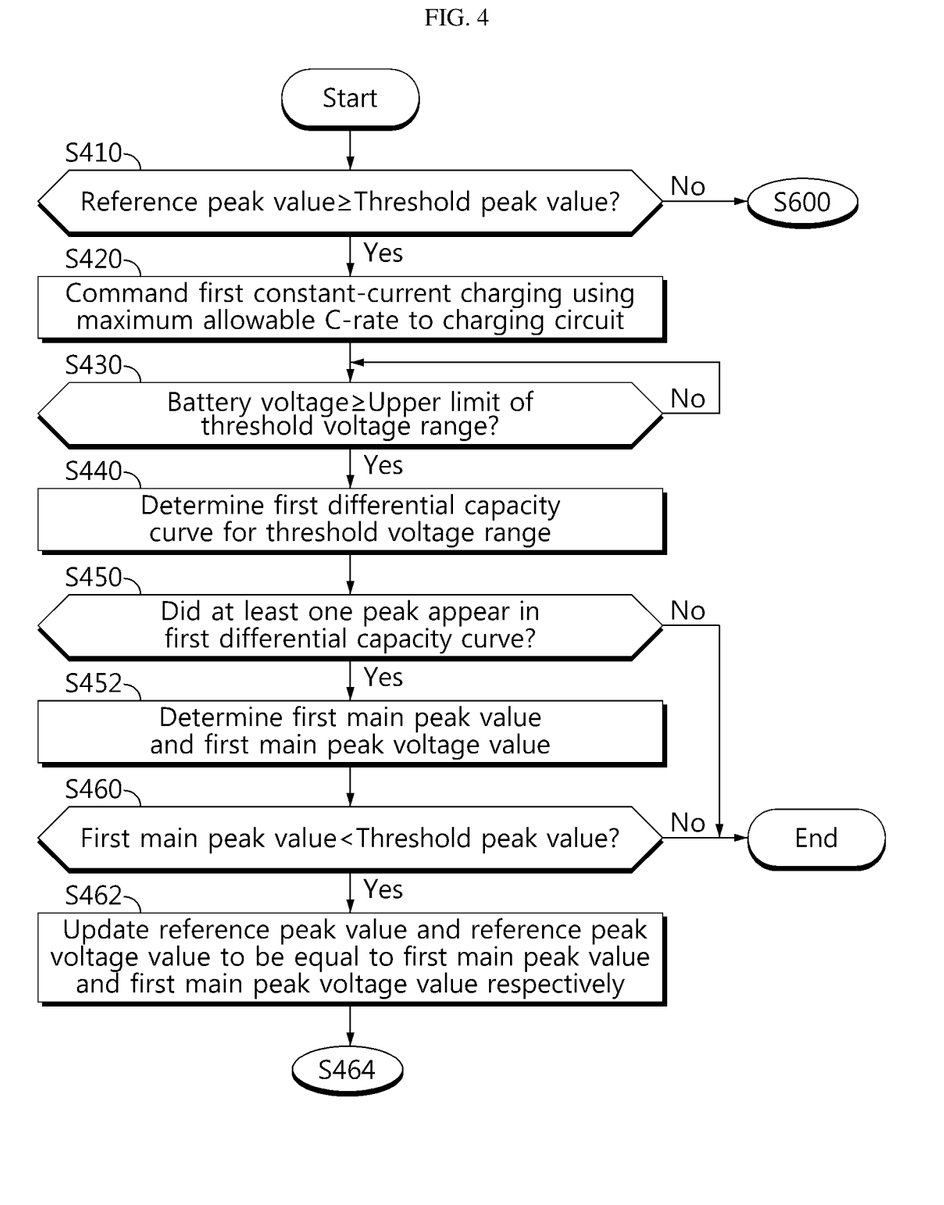
FIGS. 4 and 5 illustrate exemplarily flowcharts of a battery management method according to a first embodiment of the present disclosure.
Figure 5:
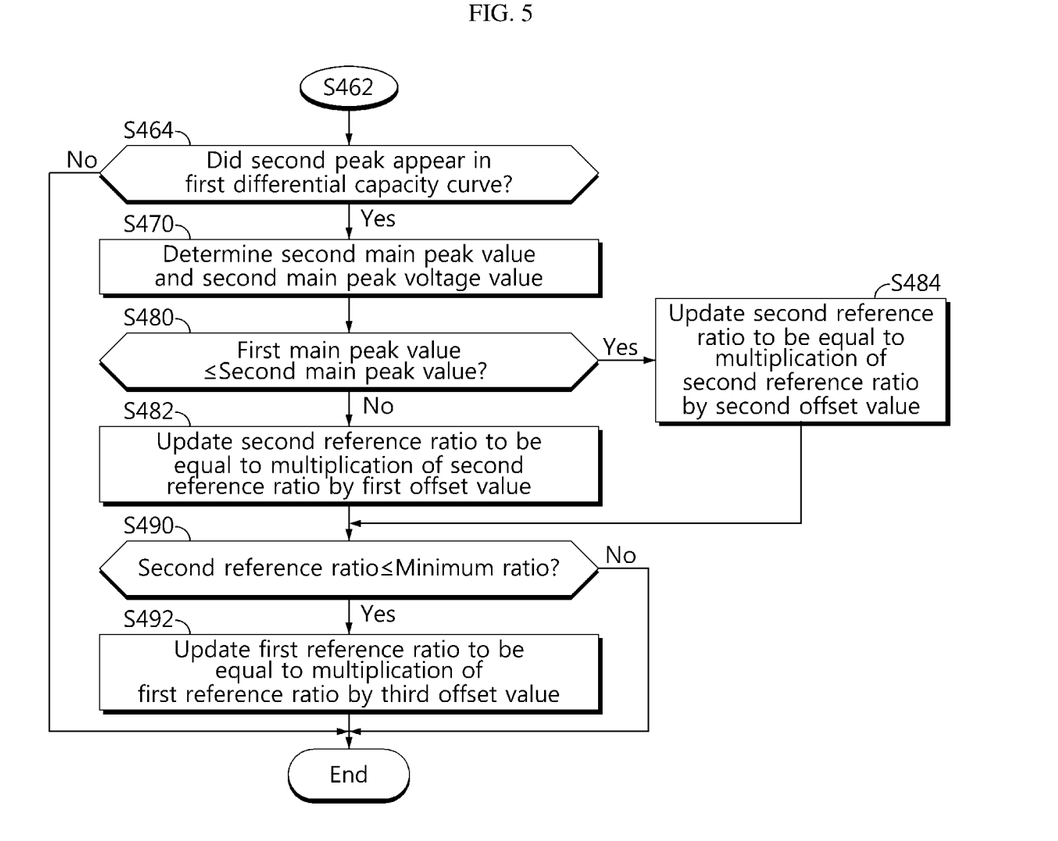
Figure 6:
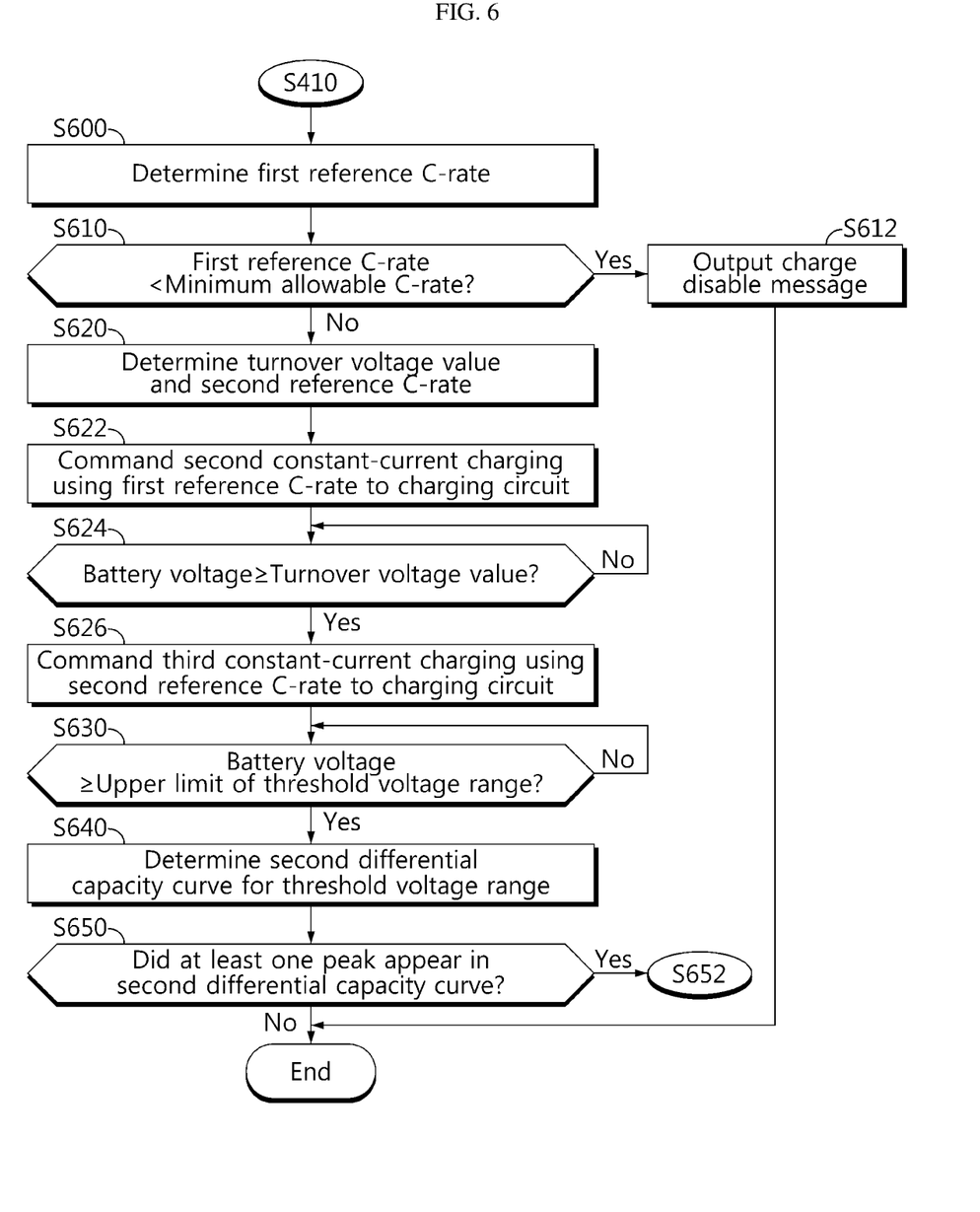
FIGS. 6 and 7 illustrate exemplarily flowcharts of a battery management method according to a second embodiment of the present disclosure.
Figure 7:
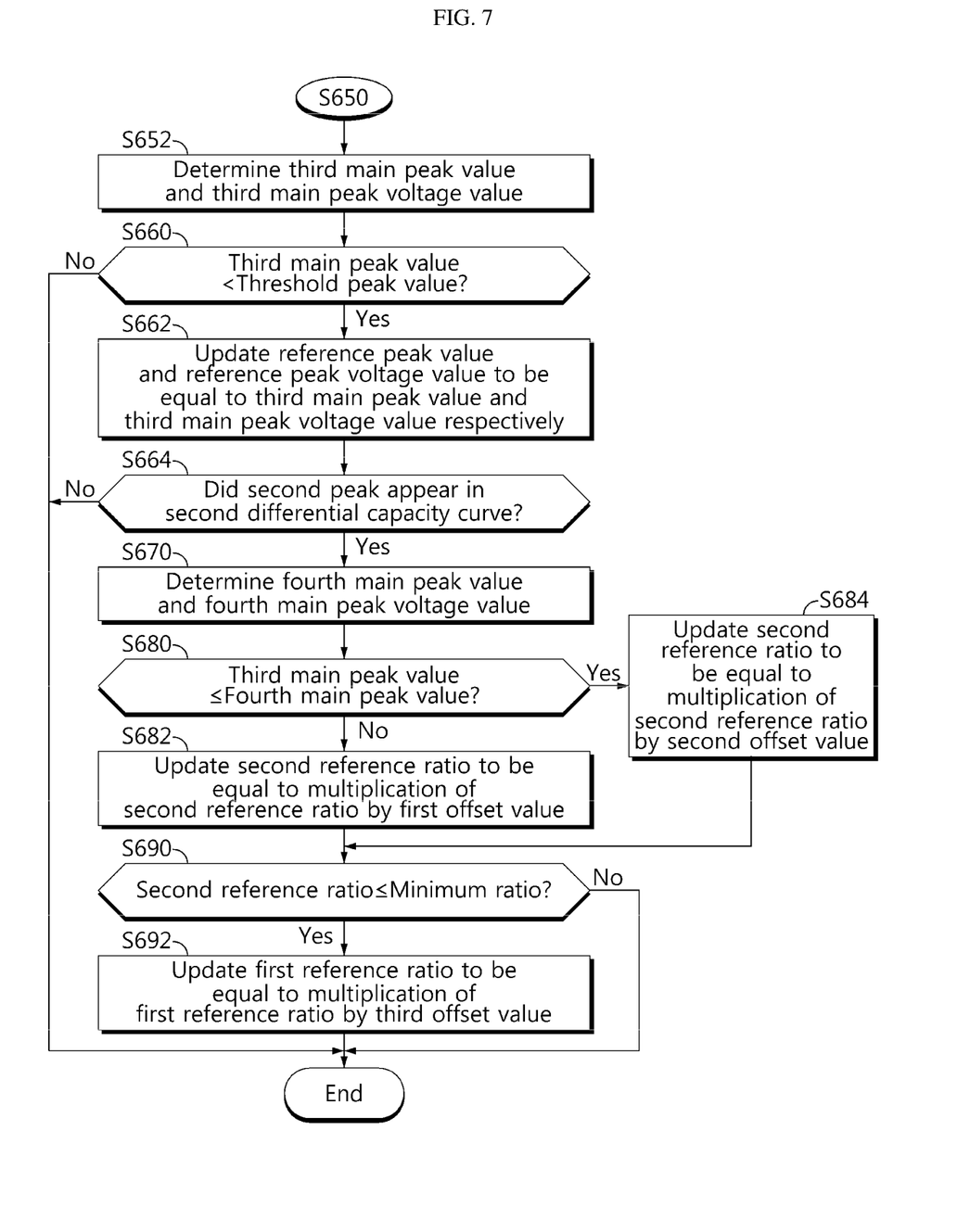

FIGS. 4 and 5 illustrate exemplarily flowcharts of a battery management method according to a first embodiment of the present disclosure, and FIGS. 6 and 7 illustrate exemplarily flowcharts of a battery management method according to a second embodiment of the present disclosure. The battery management method may be performed in response to the charge request from the high-level controller 2. In an example, the control unit 120 may start the battery management method described below when the voltage of the battery B upon receiving the charge request is equal to or less than the start voltage $V_S$.

Referring to FIGS. 1 to 5, in step S410, the control unit 120 determines whether the reference peak value of the over-potential management information is equal to or larger than the threshold peak value $M_{ref}$. A value of the step S410 being "YES" indicates that the constant-current charging event of the battery B occurred for the first time, or the first over-potential state and the second over-potential state were not detected in the previous cycle constant-current charging event. When the value of the step S410 is "YES", step S420 is performed. The value of the step S410 being "NO"

indicates that the first over-potential state or the second over-potential state has been detected in the previous cycle constant-current charging event. When the value of the step S410 is "NO", step S610 of FIG. 6 is performed.

In the step S420, the control unit 120 commands first constant-current charging using the maximum allowable C-rate to the charging circuit 20. Accordingly, the charging circuit 20 starts the first constant-current charging. The control unit 120 may collect the sensing signal from the sensing unit 110 at the preset time interval during the first constant-current charging, and record the voltage value and the electric current value indicated by the collected sensing signal in the memory unit 130.

In step S430, the control unit 120 determines whether the voltage of the battery B reached the upper limit $V_U$ of the threshold voltage range $\Delta V_{TH}$. When a value of the step S430 is "YES", step S440 is performed. When the value of the step S430 is "NO", the step S430 is repeated.

In the step S440, the control unit 120 determines a first differential capacity curve for the threshold voltage range $\Delta V_{TH}$ based on the sensing signal collected for a first charging period. The first charging period is a period of time from the time when the voltage of the battery B reaches the lower limit $V_L$ of the threshold voltage range $\Delta V_{TH}$ to the time when the voltage of the battery B reaches the upper limit $V_U$ of the threshold voltage range $\Delta V_{TH}$ by the first constant-current charging. The first differential capacity curve indicates the correlation between the voltage and the differential capacity of the battery B in the threshold voltage range $\Delta V_{TH}$.

In step S450, the control unit 120 determines whether at least one peak appears in the first differential capacity curve. When a value of the step S450 is "NO", the method according to the first embodiment may end. When the value of the step S450 is "YES", step S452 is performed.

In the step S452, the control unit 120 determines the first main peak value and the first main peak voltage value indicating the differential capacity and the voltage of the first peak of the first differential capacity curve, respectively.

In step S460, the control unit 120 determines whether the first main peak value is less than the threshold peak value $M_{ref}$. The first main peak value less than the threshold peak value $M_{ref}$ indicates that the battery B has the first over-potential state by the first constant-current charging. When a value of the step S460 is "YES", step S462 is performed. When the value of the step S460 is "NO", the method according to the first embodiment may end.

In the step 462, the control unit 120 updates the reference peak value and the reference peak voltage value of the over-potential management information to be equal to the first main peak value and the first main peak voltage value, respectively.

In step S464, the control unit 120 determines whether the second peak appears in the first differential capacity curve. When a value of the step S464 is "NO", the method according to the first embodiment may end, or move to step S482. When the value of the step S464 is "YES", step S470 is performed.

In the step S470, the control unit 120 determines the second main peak value and the second main peak voltage value indicating the differential capacity and the voltage of the second peak of the first differential capacity curve, respectively.

In step S480, the control unit 120 determines whether the first main peak value is equal to or less than the second main peak value. When a value of the step S480 is "NO", S482 is performed. The value of the step S480 being "YES" indicates that the battery B has the second over-potential state by the first constant-current charging. When the value of the step S480 is "YES", step S484 is performed.

In the step S482, the control unit 120 updates the second reference ratio to be equal to multiplication of the second reference ratio by a first offset value. The first offset value may be a positive number of less than 1 (for example, 0.9).

In the step S484, the control unit 120 updates the second reference ratio to be equal to the multiplication of the second reference ratio by a second offset value. The second offset value may be a positive number of less than 1 (for example, 0.8) that is smaller than the first offset value.

In step S490, the control unit 120 determines whether the updated second reference ratio is equal to or less than a minimum ratio. The minimum ratio may be a value that is preset to be less than the second offset value. The updated second reference ratio equal to or less than the minimum ratio indicates that it is necessary to reduce the C-rate from the start time of the next constant-current charging to suppress the over-potential of the battery B. When a value of the step S490 is "NO", the method according to the first embodiment may end. When the value of the step S490 is "YES", step S492 is performed.

In the step S492, the control unit 120 updates the first reference ratio to be equal to the multiplication of the first reference ratio by a third offset value. The third offset value may be a positive number of less than 1.

Referring to FIG. 6, in step S600, the control unit 120 determines a first reference C-rate by multiplying the maximum allowable C-rate by the first reference ratio. When the first reference ratio is less than 1, the first reference C-rate will be smaller than the maximum allowable C-rate.

In step S610, the control unit 120 determines whether the first reference C-rate is less than the minimum allowable C-rate. When a value of the step S610 is "YES", step S612 is performed. When the value of the step S610 is "NO", step S620 is performed.

In the step S612, the control unit 120 outputs a charge disable message. The charge disable message indicates that it is necessary to replace the battery B due to the severe over-potential feature caused by the degradation of the battery B. The charge disable message may be transmitted to the high-level controller 2 through the interface unit 140.

In the step S620, the control unit 120 determines a turnover voltage value and a second reference C-rate. The turnover voltage value may be the larger one of a voltage value that is smaller than the reference peak voltage value by a predetermined scaling voltage value (for example, 0.05 V) and (ii) the lower limit $V_L$ of the threshold voltage range $\Delta V_{TH}$. The second reference C-rate may be equal to multiplication of the maximum allowable C-rate by the second reference ratio. The reason of determining the turnover voltage value is to reduce the C-rate of the charge current before the voltage of the battery B reaches the voltage at which the first over-potential state occurred in the previous cycle constant-current charging event during the current cycle constant-current charging event.

In step S622, the control unit 120 commands second constant-current charging using the first reference C-rate to the charging circuit 20. Accordingly, the charging circuit 20 starts the second constant-current charging. The control unit 120 may collect the sensing signal from the sensing unit 110 at the preset time interval during the second constant-current charging, and record the voltage value and the electric current value indicated by the collected sensing signal in the memory unit 130.

In step S624, the control unit 120 determines whether the voltage of the battery B reaches the turnover voltage value. When a value of the step S624 is "YES", step S626 is performed. When the value of the step S624 is "NO", the step S624 is repeated.

In the step S626, the control unit 120 commands third constant-current charging using the second reference C-rate to the charging circuit 20. Accordingly, the charging circuit 20 changes the second constant-current charging to the third constant-current charging. The control unit 120 may collect the sensing signal from the sensing unit 110 at the preset time interval during the third constant-current charging, and record the voltage value and the electric current value indicated by the collected sensing signal in the memory unit 130.

In step S630, the control unit 120 determines whether the voltage of the battery B reaches the upper limit $V_U$ of the threshold voltage range $\Delta V_{TH}$. When a value of the step S630 is "YES", step S640 is performed. When the value of the step S430 is "NO", the step S630 is repeated.

In the step S640, the control unit 120 determines a second differential capacity curve for the threshold voltage range $\Delta V_{TH}$ based on the sensing signal collected for a second charging period. The second charging period is a period of time from the time when the voltage of the battery B reaches the lower limit $V_L$ of the threshold voltage range $\Delta V_{TH}$ to the time when the voltage of the battery B reaches the upper limit $V_U$ of the threshold voltage range $\Delta V_{TH}$ by the second constant-current charging and the third constant-current charging. The second differential capacity curve indicates the correlation between the voltage and the differential capacity of the battery in the threshold voltage range $\Delta V_{TH}$.

In step S650, the control unit 120 determines whether at least one peak appears in the second differential capacity curve. When a value of the step S650 is "NO", the method according to the second embodiment may end. When the value of the step S650 is "YES", step S652 is performed.

In the step S652, the control unit 120 determines a third main peak value and a third main peak voltage value indicating the differential capacity and the voltage of the first peak of the second differential capacity curve, respectively.

In step S660, the control unit 120 determines whether the third main peak value is less than the threshold peak value $M_{ref}$. The third main peak value less than the threshold peak value $M_{ref}$ indicates that the battery B has the first over-potential state by the second constant-current charging and the third constant-current charging. When a value of the step S660 is "YES", step S662 is performed. When the value of the step S660 is "NO", the method according to the second embodiment may end.

In the step S662, the control unit 120 updates the reference peak value and the reference peak voltage value of the over-potential management information to be equal to the third main peak value and the third main peak voltage value, respectively.

In step S664, the control unit 120 determines whether the second peak appears in the second differential capacity curve. When a value of the step S664 is "NO", the method according to the second embodiment may end or move to step S682. When the value of the step S664 is "YES", step S670 is performed.

In the step S670, the control unit 120 determines a fourth main peak value and a fourth main peak voltage value indicating the differential capacity and the voltage of the second peak of the second differential capacity curve, respectively.

In step S680, the control unit 120 determines whether the third main peak value is equal to or less than the fourth main peak value. When a value of the step S680 is "NO", step S682 is performed. The value of the step S680 being "YES" indicates that the battery B has the second over-potential state by the second constant-current charging and the third constant-current charging. When the value of the step S680 is "YES", step S684 is performed.

In the step S682, the control unit 120 updates the second reference ratio to be equal to the multiplication of the second reference ratio by a first offset value. The first offset value may be a positive number of less than 1 (for example, 0.9).

In the step S684, the control unit 120 updates the second reference ratio to be equal to the multiplication of the second reference ratio by a second offset value. The second offset value may be a positive number of less than 1 (for example, 0.8) that is smaller than the first offset value.

In step S690, the control unit 120 determines whether the updated second reference ratio is equal to or less than a minimum ratio. The minimum ratio may be a value that is preset to be less than the second offset value. The updated second reference ratio equal to or less than the minimum ratio indicates that it is necessary to reduce the C-rate from the start time of the next constant-current charging to suppress the over-potential of the battery B. When a value of the step S690 is "NO", the method according to the second embodiment may end. When the value of the step S690 is "YES", step S692 is performed.

In the step S692, the control unit 120 updates the first reference ratio to be equal to the multiplication of the first reference ratio by a third offset value. The third offset value may be a positive number of less than 1.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:
1. A battery management system, comprising:
a voltage sensor configured to generate a voltage sensing signal indicating a voltage of a battery;
a current sensor configured to generate a current sensing signal indicating a voltage of a battery;
memory configured to store over-potential management information including a reference peak value and a reference peak voltage value; and
a controller wherein the memory has programmed thereon instructions that, when executed by the controller, cause the controller to:
command first constant-current charging using a maximum allowable current rate (C-rate) to a charging circuit connected to the battery, in response to the reference peak value being equal to or larger than a threshold peak value when a charge request is received;
determine a first differential capacity curve indicating a correlation between the voltage of the battery and a differential capacity of the battery for a range of voltages within a threshold voltage range based on the voltage and current sensing signals generated during the first constant-current charging;
determine a first main peak value indicating a differential capacity of a first peak of the first differential capacity curve;
determine a first main peak voltage value indicating a voltage of the first peak of the first differential capacity curve; and
update the reference peak value to be equal to the first main peak value and the reference peak voltage value to be equal to the first main peak voltage value, in response to the first main peak value being less than the threshold peak value.

2. The battery management system according to claim 1, wherein the over-potential management information further includes a first reference ratio, and
wherein the instructions are configured to cause the controller to:
determine a first reference C-rate by multiplying the maximum allowable C-rate by the first reference ratio in response to the reference peak value being less than the threshold peak value; and
command second constant-current charging using the first reference C-rate to the charging circuit in response to the first reference C-rate being equal to or larger than a minimum allowable C-rate.

3. The battery management system according to claim 2, wherein the over-potential management information further includes a second reference ratio, and
wherein the instructions are configured to cause the controller:
determine a second reference C-rate by multiplying the maximum allowable C-rate by the second reference ratio;
command third constant-current charging using the second reference C-rate to the charging circuit, in response to the voltage of the battery reaching a turnover voltage value smaller than the reference peak voltage value by a scaling voltage value during the second constant-current charging;
determine a second differential capacity curve indicating a correlation between the voltage and the differential capacity of the battery in the threshold voltage range based on the voltage and current sensing signals generated during the second constant-current charging and the third constant-current charging;
determine a third main peak value indicating a differential capacity of a first peak of the second differential capacity curve;
determine a third main peak voltage value indicating a voltage of the first peak of the second differential capacity curve; and
update the reference peak value to be equal to the third main peak value and the reference peak voltage value to be equal to the third main peak voltage value, in response to the third main peak value being less than the threshold peak value.

4. The battery management system according to claim 2, wherein the instructions are configured to cause the controller to output a charge disable message in response to the first reference C-rate being less than the minimum allowable C-rate.

5. The battery management system according to claim 2, wherein the over-potential management information further includes a second reference ratio, and
wherein the instructions are configured to cause the controller to:
determine a second main peak value indicating a differential capacity of a second peak of the first differential capacity curve and a second main peak voltage value indicating a voltage of the second peak of the first differential capacity curve, in response to the first main peak value being less than the threshold peak value; and
update the second reference ratio to be equal to the second reference ratio multiplied by a first offset value, in response to the first main peak value being larger than the second main peak value,
wherein the first offset value is a positive number less than 1.

6. The battery management system according to claim 5, wherein the instructions are configured to cause the controller to update the second reference ratio to be equal to the second reference ratio multiplied by a second offset value, in response to the first main peak value being equal to or less than the second main peak value, and
wherein the second offset value is a positive number less than 1 and smaller than the first offset value.

7. The battery management system according to claim 6, wherein the instructions are configured to cause the controller to update the first reference ratio to be equal to the first reference ratio multiplied by a third offset value, in response to the updated second reference ratio being equal to or less than a predetermined minimum ratio,
wherein the third offset value is a positive number of less than 1.

8. The battery management system according to claim 3, wherein the instructions are configured to cause the controller to:
determine a fourth main peak value indicating a differential capacity of a second peak of the second differential capacity curve and a fourth main peak voltage value indicating a voltage of the second peak of the second differential capacity curve, in response to the third main peak value being less than the threshold peak value, and
update the second reference ratio to be equal to the second reference ratio multiplied by a first offset value, in response to the third main peak value being larger than the fourth main peak value,
wherein the first offset value is a positive number less than 1.

9. The battery management system according to claim 8, wherein the instructions are configured to cause the controller to update the second reference ratio to be equal to the second reference ratio multiplied by a second offset value, in response to the third main peak value being equal to or less than the fourth main peak value,
wherein the second offset value is a positive number less than 1 and smaller than the first offset value.

10. A battery pack comprising the battery management system according to claim 1.

11. An electric vehicle comprising the battery pack according to claim 10.

12. A battery management method, comprising:
commanding, by a controller, first constant-current charging using a maximum allowable C-rate to a charging circuit connected to a battery, in response to a reference peak value included in over-potential management information of the battery being equal to or larger than a threshold peak value, when a charge request is received;
determining, by the controller, a first differential capacity curve indicating a correlation between a voltage of the battery and a differential capacity of the battery for a range of voltages within a threshold voltage range based on voltage and current measurements of the battery collected during the first constant-current charging;
determining, by the controller, a first main peak value indicating a differential capacity of a first peak of the first differential capacity curve;
determining, by the controller, a first main peak voltage value indicating a voltage of the first peak of the first differential capacity curve; and
updating, by the controller, the reference peak value to be equal to the first main peak value and the reference peak voltage value to be equal to the first main peak voltage value, in response to the first main peak value being less than the threshold peak value.

* * * * *